United States Patent [19]

Gourlain et al.

[11] Patent Number: 4,837,531

[45] Date of Patent: Jun. 6, 1989

[54] THREE-ACCESS POLARIZATION AND FREQUENCY DUPLEXING DEVICE

[75] Inventors: Philippe Gourlain, Leguevin; Régis Lenormand, Toulouse; Dominique Morin, Muret, all of France

[73] Assignee: Alcatel Espace, Courbivoie, France

[21] Appl. No.: 7,863

[22] Filed: Jan. 28, 1987

[30] Foreign Application Priority Data

Jan. 28, 1986 [FR] France ................................ 86 01160

[51] Int. Cl.[4] ........................ H03H 7/46; H01P 1/213

[52] U.S. Cl. .................................. 333/135; 333/21 A

[58] Field of Search ............... 333/126, 129, 134, 135, 333/137, 21 R, 21 A

[56] References Cited

U.S. PATENT DOCUMENTS

| | | | |
|---|---|---|---|
| 2,975,380 | 3/1961 | Scharfman | 333/21 A X |
| 3,327,250 | 6/1967 | Sleeper, Jr. | 333/21 R |
| 3,566,309 | 2/1971 | Ajioka | 333/135 |
| 3,924,205 | 12/1975 | Hansen et al. | 333/21 A |
| 4,047,128 | 9/1977 | Morz | 333/21 A X |
| 4,410,866 | 10/1983 | Bui-Hai | 333/135 |
| 4,491,810 | 1/1985 | Saad | 333/135 |
| 4,546,471 | 10/1985 | Bui-Hai | 333/135 X |
| 4,622,524 | 11/1986 | Morz | 333/135 X |

FOREIGN PATENT DOCUMENTS

| | | | |
|---|---|---|---|
| 0154692 | 9/1985 | European Pat. Off. . | |
| 2117980 | 10/1983 | United Kingdom . | |
| 2166297 | 4/1986 | United Kingdom | 333/21 A |

*Primary Examiner*—Eugene R. Laroche
*Assistant Examiner*—Benny Lee
*Attorney, Agent, or Firm*—Sughrue, Mion, Zinn, Macpeak & Seas

[57] ABSTRACT

A three-access polarization and frequency duplexing device has in series a common circular waveguide for passing two polarizations of a wave within a low-frequency band and one polarizations of a wave within a high-frequency band, a first access waveguide which opens into the common waveguide and a transition, a secondary rectangular waveguide. The narrow sides of the secondary waveguide are parallel to one polarization of the low-frequency band and the broad sides are parallel to the polarization of the high-frequency band. A second access waveguide is connected to the secondary waveguide at right angles and coupled by a resonant slot. A short-circuit plate performs a short-circuiting function for the high-frequency portion of the wave of the high-frequency band aligned with the second access waveguide. The free end of the secondary waveguide being forms a third access waveguide. The first access waveguide has a filter for selecting a polarization of the wave from the low-frequency band. The second access waveguide is at right angles to the broad side of the secondary guide.

1 Claim, 1 Drawing Sheet

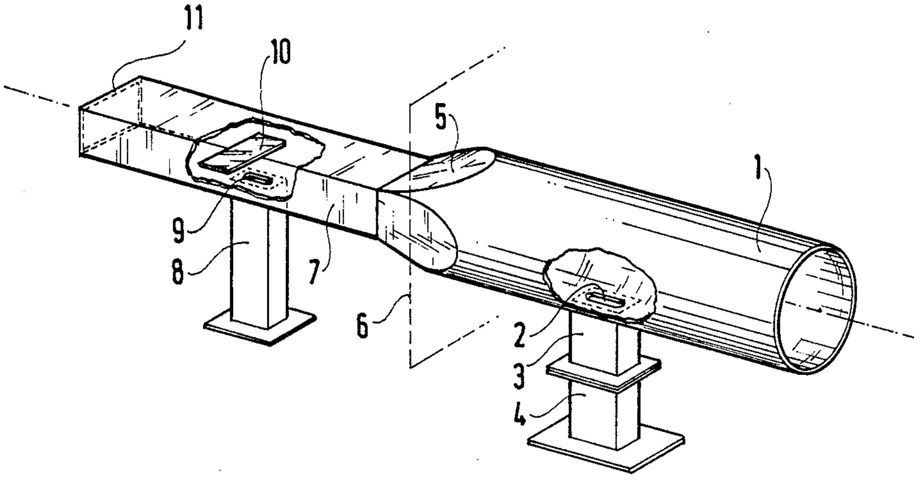
11
10
5
1
9
8
7
6
2
3
4

THREE-ACCESS POLARIZATION AND FREQUENCY DUPLEXING DEVICE

BACKGROUND OF THE INVENTION

1. Field of the Invention

The present invention relates to a three-access polarization and frequency duplexing device.

2. Description of the Prior Art

In the field of polarization duplexers, one known type is the orthogonal-mode duplexer which has a main waveguide with a short-circuit plate placed in the axis of the main waveguide and other waveguide or so-called parallel-access waveguide at right angles to the first and placed in a critical position with respect to said short-circuit plate. This very conventional device has the disadvantage of being limited to the use of a single frequency or frequency band.

Another known type of duplexing device is described in French patent Application No. 8502209 filed on Feb. 15, 1985. In this device, a main waveguide has the function of transmitting the frequency or frequency band to be multiplexed as well as other frequency bands to two access waveguides at right angles to the main waveguide and at right angles to each other, said access waveguides being coupled to the main waveguide by means of resonant slots.

Having two outputs in different planes is often not compatible with system design requirements from a physical arrangement standpoint.

European patent Application No. EP-A-0098192 describes a multiplexing device for grouping two frequency bands, the specific application considered being a multiband antenna. Starting from the coupling access to the antenna, this device comprises in series a common circular waveguide for passing a band of high frequencies and a band of low frequencies into which open via two coupling holes relatively displaced along the common circular waveguide two waveguides at right angles to each other and constituting the accesses for the two orthogonal polarizations of the low-frequency band, a circular waveguide to circular waveguide transition, a polarization duplexer for the high-frequency band. Resonators which form a short-circuit for the frequencies of the high-frequency band are placed within the coupling holes. Looking from the coupling access to the antenna, there are placed within the common circular waveguide, between the first and the second coupling hole, a first quasi-optical filter having the function of reflecting towards the first coupling hole the waves which are located within the low-frequency band and the polarization of which is that of the wave to be passed through the first hole and, between the second coupling hole and the transition, a second quasi-optical filter having the function of reflecting towards the second coupling hole the waves which are located within the low-frequency band and the polarization of which is that of the wave to be passed through the second hole.

With respect to the aforementioned device of the prior art, the construction and application of the device in accordance with the present invention can be carried out much more simply with two low-frequency accesses and one high-frequency access and not the reverse.

SUMMARY OF THE INVENTION

This invention relates to a device for extracting or exciting at a low frequency two orthogonal planes of polarization of the fundamental mode and for extracting or exciting at a high frequency a plane of polarization of the fundamental mode which is coplanar with one of the planes of polarization of the low frequency.

The present invention is directed to a three-access polarization and frequency duplexing device comprising, in series with respect to a coupling access to an antenna, a common circular waveguide for passing two orthogonal polarizations of a wave within a low-frequency band and one polarization of a wave within a high-frequency band parallel to one of the two orthogonal polarizations of the wave at low frequencies, a transition, a secondary waveguide, a first access waveguide for one of the two orthogonal polarizations of the low-frequency wave which opens through a resonant slot into the common waveguide at right angles thereto, a second waveguide providing access to the secondary waveguide, located at right angles and coupled thereto by a resonant slot, a short-circuit plate which performs a short-circuiting function for the high-frequency portion of the wave and is intended for said second access waveguide, a third access waveguide or series access guide being formed by the free end of the secondary waveguide. The distinctive feature of the duplexer lies in the fact that the secondary waveguide is a rectangular guide, the narrow side of which is parallel to the second polarization of the low-frequency wave and the broad side of which is parallel to the polarization of the high-frequency wave, that the first waveguide providing access to the common waveguide has a filter for selecting the low-frequency wave by providing a short circuit for the high-frequency wave at the resonant slot the second access waveguide is at right angles to the broad side of the secondary waveguide and constitutes the access for said polarization of the high-frequency wave.

The great advantage of the present invention is that two outputs are located in the same plane and are therefore readily accessible, which is highly important in the field of space communications.

BRIEF DESCRIPTION OF THE DRAWING

The single accompanying FIG. is a view of the device in accordance with the invention, this view being taken in perspective with portions broken away.

DETAILED DESCRIPTION OF THE INVENTION

The device of the invention is a device for excitation at a low frequency F1 as well as a device for extraction or excitation of a component of the fundamental mode corresponding to a high frequency F2.

This device comprises a main waveguide 1 corresponding to the fundamental mode of the frequency F1, an access waveguide 4 corresponding to the frequency F1 at right angles to the main waveguide 1, a transition 5 between the main waveguide 1 and a rectangular waveguide 7. The rectangular waveguide has broad sides corresponding to the fundamental mode of the frequency F1 and narrow sides corresponding to the fundamental mode of the frequency F2 and an access waveguide 8 corresponding to the frequency F2 at right angles to the broad side of the rectangular waveguide 7. Said rectangular waveguide 7 is provided with a short-circuit plate 10 which is parallel to its broad side. The access guide 4 at right angles to the main guide 1 and the access guide 8 at right angles to the rectangular guide 7 are coplanar along the longitudinal direction. The access guide 4 at right angles to the main guide 1 is coupled to this latter by means of a resonant slot 2. Said access guide 4 is provided with a filter 3 for selecting the frequency F1, said filter 3 being constructed in such a manner as to provide a short-circuit at the resonate slot 2 for the frequencies outside said frequency F1. The access guide 8 at right angles to the rectangular guide 7 is coupled to the rectangular guide 7 by means of a resonant slot 9 and placed in a predetermined position with respect to the short-circuit plate 10.

The operation of the device described in the foregoing will now be explained.

It is postulated by way of example that the device in accordance with the invention is connected to a receiving aerial. Arriving from this aerial are two waves having orthogonal polarizations at a first frequency F1 or 12 GHz, for example, and a wave at a second frequency F2 of 18 GHz, for example, having a polarization parallel to one of the planes of polarization at the frequency F1. The waves having a frequency F1 propagate within the main waveguide 1 in its fundamental mode and with two orthogonal polarizations.

The first polarization of the first frequency F1 is located in the plane of the figure and the second polarization is at right angles to this plane.

At the moment of arrival of the component parallel to the plane of the slot 2 at the level of the slot 2, a first portion of said component is diverted by the coupling slot 2 towards the filter 3 and therefore towards the access waveguide 4.

That portion of said component which is not directed towards the waveguide 4 continues to propagate within the waveguide 1, then within the first portion of the transition 5 in which it is reflected at the short-circuit plane 6, then returns to the coupling slot 2 and is directed by the coupling slot 2 to the waveguide 4 as explained earlier. Part of the wave (which is in fact negligible in practice) which is not directed to the waveguide 4 at that moment is then reflected towards the radiating element.

As is well-known to those versed in the art, it is apparent that the distance between the shortcircuit plane 6 and the radiating slot 2 is so adjusted as to ensure that a maximum amount of reflected waves is absorbed by the waveguide 4.

The component of the second frequency F2 propagates within the main waveguide 1 without being diverted by the coupling slot 2 which in any case performs a short-circuit function with respect to this frequency, then within the transition 5 so as to continue along its path within the rectangular waveguide 7. Said component is partly directed towards the waveguide 8 via the resonant slot 9 which is so dimensioned as to exhibit resonance at said frequency F2.

That portion of said component which is not directed towards the waveguide 8 continues to propagate within the waveguide 7 in which it is reflected from the short-circuit plate 10 so as to return to the coupling slot 9.

Part of the wave which is in any case negligible in practice and is not directed towards the waveguide 8 at that moment is accordingly reflected towards the radiating element.

As will be readily apparent, the distance between the short-circuit plate 10 and the resonant slot 9 is adjusted in a manner known to those versed in the art so as to ensure that maximum amount of reflected waves is absorbed by the access waveguide 8.

The second frequency component F1 at right angles to the plane of the slot 2 propagates within the main waveguide in the transition 5 and within the waveguide 7 without being diverted either by the coupler 2 or by the coupler 9 or by the short-circuit plate 10 and passes toward the so-called "series access" 11.

The device described in the foregoing has a wide range of advantageous applications. For example, it is possible to employ this device in a primary source (feed) of a multisource antenna. This antenna operates with three accesses, for example with two reception accesses, one transmission access, and conversely or with one transmission access, one reception access, and one angle-error measurement access.

It is possible to place an absorber element within the access waveguide 11. In any linear polarization, the received component at right angles to the extracted component will be absorbed by the absorber element in both frequency bands and thus will not disturb the operation of the source.

It is readily apparent that the present invention has been described and illustrated solely by way of preferential example and that is constituent elements can be replaced by equivalent means without thereby departing either from the scope or the spirit of the invention.

It will be understood that the frequencies F1 and F2 referred-to in the foregoing are intended to designate a low-frequency band and a high-frequency band respectively.

What is claimed is:

1. A three-access polarization and frequency duplexing device comprising:

in series with respect to a coupling access to an antenna, a common circular waveguide, having an axis perpendicular to its circular cross-section, for passing two orthogonal polarizations of a wave within a low-frequency band and one polarization of a wave within a high frequency band parallel to one of the two orthogonal polarizations of the low-frequency wave, a transition and a second waveguide having an axis, said device further comprising a first access waveguide for one of the two orthogonal polarizations of the low-frequency wave connected to said common waveguide and opening through a first resonant slot into the common waveguide and being at right angles to the axis of said common waveguide, and a second access waveguide providing access to the secondary waveguide at right angles to the axis of said secondary waveguide and coupled to said secondary waveguide by a second resonant slot, a short-circuit plate positioned within said secondary waveguide adjacent said second resonant slot and performing a short-circuit function for the high-frequency portion of the wave which is directed towards said second access waveguide, a third, series access guide formed by a free end of the secondary waveguide opposite an end of said secondary waveguide proximate to said transition, wherein the secondary waveguide is a rectangular guide having narrow sides and broad sides, the narrow sides of the secondary waveguide being parallel to the second polarization of the low-frequency wave and the broad sides of the secondary waveguide being parallel to the polarization of the high-frequency wave, wherein the first access waveguide providing access to the common waveguide includes a filter for selecting the low-frequency wave by providing a short-circuit for the high-frequency wave at the level of the first resonant slot, wherein the second access wavelength is at right angles to the broad sides of the secondary waveguide and constitutes the access for said polarization of the high-frequency wave, and wherein said series access guide propagates the other of said two orthogonal polarizations of said low-frequency wave.

* * * * *